(12) United States Patent
Chou et al.

(10) Patent No.: US 8,278,709 B2
(45) Date of Patent: Oct. 2, 2012

(54) HIGH VOLTAGE METAL-OXIDE-SEMICONDUCTOR TRANSISTOR WITH STABLE THRESHOLD VOLTAGE AND RELATED MANUFACTURING METHOD

(75) Inventors: Chun-Yu Chou, Tainan County (TW); Chien-Liang Tung, Tainan County (TW); Chi-Wei Lin, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 0 days.

(21) Appl. No.: 12/898,668

(22) Filed: Oct. 5, 2010

(65) Prior Publication Data
US 2012/0080752 A1 Apr. 5, 2012

(51) Int. Cl.
*H01L 29/66* (2006.01)
(52) U.S. Cl. .................... 257/336; 257/E29.256
(58) Field of Classification Search .......... 257/336, 257/337, E29.256; 438/197
See application file for complete search history.

(56) References Cited

U.S. PATENT DOCUMENTS 5,352,914 A * 10/1994 Farb .............................. 257/345
7,011,998 B1 * 3/2006 Ju et al. ......................... 438/197

* cited by examiner

*Primary Examiner* — Tucker Wright
(74) *Attorney, Agent, or Firm* — Winston Hsu; Scott Margo

(57) ABSTRACT

A high voltage metal-oxide-semiconductor (HVMOS) transistor includes a gate poly, wherein a channel is formed in an area projected from the gate poly in a thickness direction when the HVMOS is activated; two carrier drain drift regions, adjacent to the area projected from the gate poly, wherein at least one of the carrier drain drift regions has a gradient doping concentration; and two carrier plus regions, respectively locate within the two carrier drain drift regions, wherein the two carrier plus regions and the two carrier drain drift regions are communicating with each other through the channel when the HVMOS is activated.

5 Claims, 6 Drawing Sheets

First implantation

Second implantation and third implantation

Fourth implantation

HIGH VOLTAGE METAL-OXIDE-SEMICONDUCTOR TRANSISTOR WITH STABLE THRESHOLD VOLTAGE AND RELATED MANUFACTURING METHOD

BACKGROUND OF THE INVENTION

1. Field of the Invention

The present invention relates to a high voltage metal-oxide-semiconductor (HVMOS) transistor, and more particularly, to a HVMOS transistor with improved channel hot carrier performance, and a related method of manufacturing the HVMOS transistor.

2. Description of the Prior Art

When a metal-oxide-semiconductor (MOS) transistor undergoes stress, an intense vertical electric field is created around a channel which transmits carriers from the source terminal to the drain terminal, causing some carriers in the channel to be forcibly injected into the gate terminal, resulting in damage to the Si/SiO2 interface. Please refer to FIG. 1, which is an exemplary diagram of a channel hot carrier in an N-type MOS transistor. The N-type MOS transistor includes a P well within a substrate SUB, a gate poly PO guarded by two spacers SP, and two carrier plus regions N+ located within N-type drain drift (NDD) regions NDD. When the N-type MOS transistor is activated to enter an on-state, a channel NC is built under the gate poly PO to connect drain and source terminals via the N+ regions and the NDD regions. If the bias voltage applied to the gate is raised to a value as high as the bias voltage at the drain terminal, the N-type MOS transistor is stressed. Under this circumstance, an intense electric field is built across the channel NC, and therefore certain hot carriers, i.e., carriers with huge energy, are forcibly injected into the gate poly PO and trapped inside a gate oxide layer, leading to permanent damage to the N-type MOS transistor, and the gate voltage cannot effectively control channel conduction as well.

For a conventional high voltage metal-oxide-semiconductor (HVMOS) transistor made by a high voltage (HV) process, the channel hot carrier may cause serious problems. For example, when an HVMOS transistor is operated under maximum operating voltage or stressed for a long time, the threshold thereof will drift and cause permanent damage. Please refer to FIG. 2, which is a diagram of a threshold voltage Vt variation of a conventional HVMOS transistor versus time when the conventional HVMOS transistor is operated under maximum operating voltage. Consider a case where the conventional HVMOS is operated with a maximum operating voltage of 20 V applied to both the gate and the drain terminals under a temperature of 140° C. It can be seen from the figure that the threshold voltage suffers from a serious variation—about 150% variation—after 24 hours.

Therefore, to fabricate more reliable semiconductor products, the channel hot carrier issue of an HVMOS transistor must be overcome so a stable threshold voltage can be sustained under any circumstance.

SUMMARY OF THE INVENTION

In light of this, the present invention provides a high voltage metal-oxide-semiconductor (HVMOS) transistor and a manufacturing method thereof to solve the channel hot carrier issues.

In one embodiment of the present invention, an exemplary high voltage metal-oxide-semiconductor (HVMOS) transistor is provided. The exemplary HVMOS transistor comprises a gate poly, two carrier drain drift regions, and two carrier plus regions. A channel is formed in an area projected from the gate poly in a thickness direction when the HVMOS is activated. The two carrier drain drift regions are adjacent to the area projected from the gate poly, wherein at least one of the carrier drain drift regions has a gradient doping concentration. The two carrier plus regions are respectively located within the two carrier drain drift regions, wherein the two carrier plus regions and the two carrier drain drift regions are communicating with each other through the channel when the HVMOS is activated.

In a second embodiment of the present invention, an exemplary method of manufacturing a high voltage metal-oxide-semiconductor (HVMOS) transistor is provided. The exemplary method comprises forming a gate poly; forming two carrier drain drift regions adjacent to an area projected from the gate poly, wherein at least one of the carrier drain drift regions has a gradient doping concentration; and forming two carrier plus regions, located within the carrier drain drift regions, respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
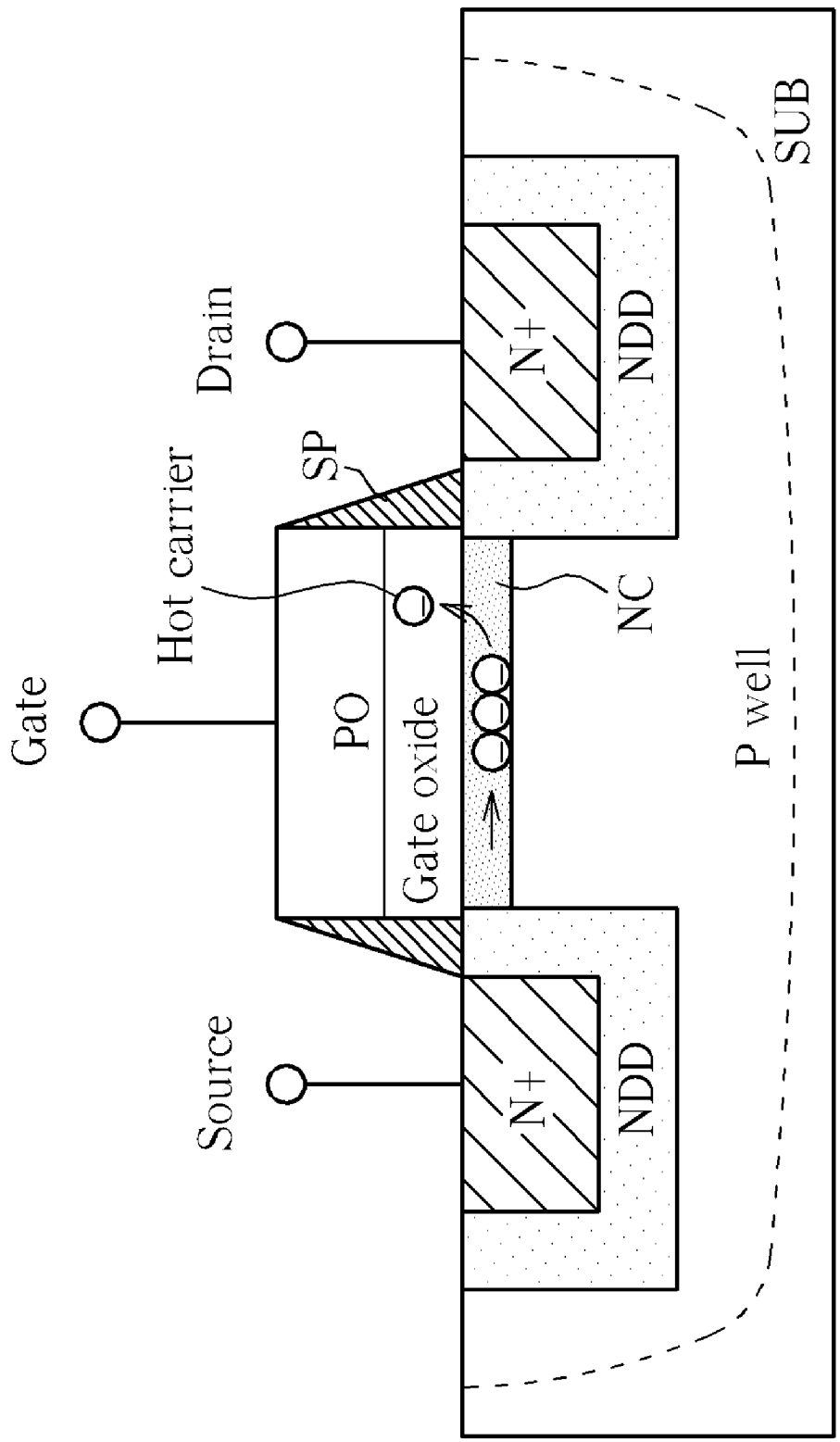
FIG. 1 is an exemplary diagram of a channel hot carrier in an N-type MOS transistor.
Figure 2:
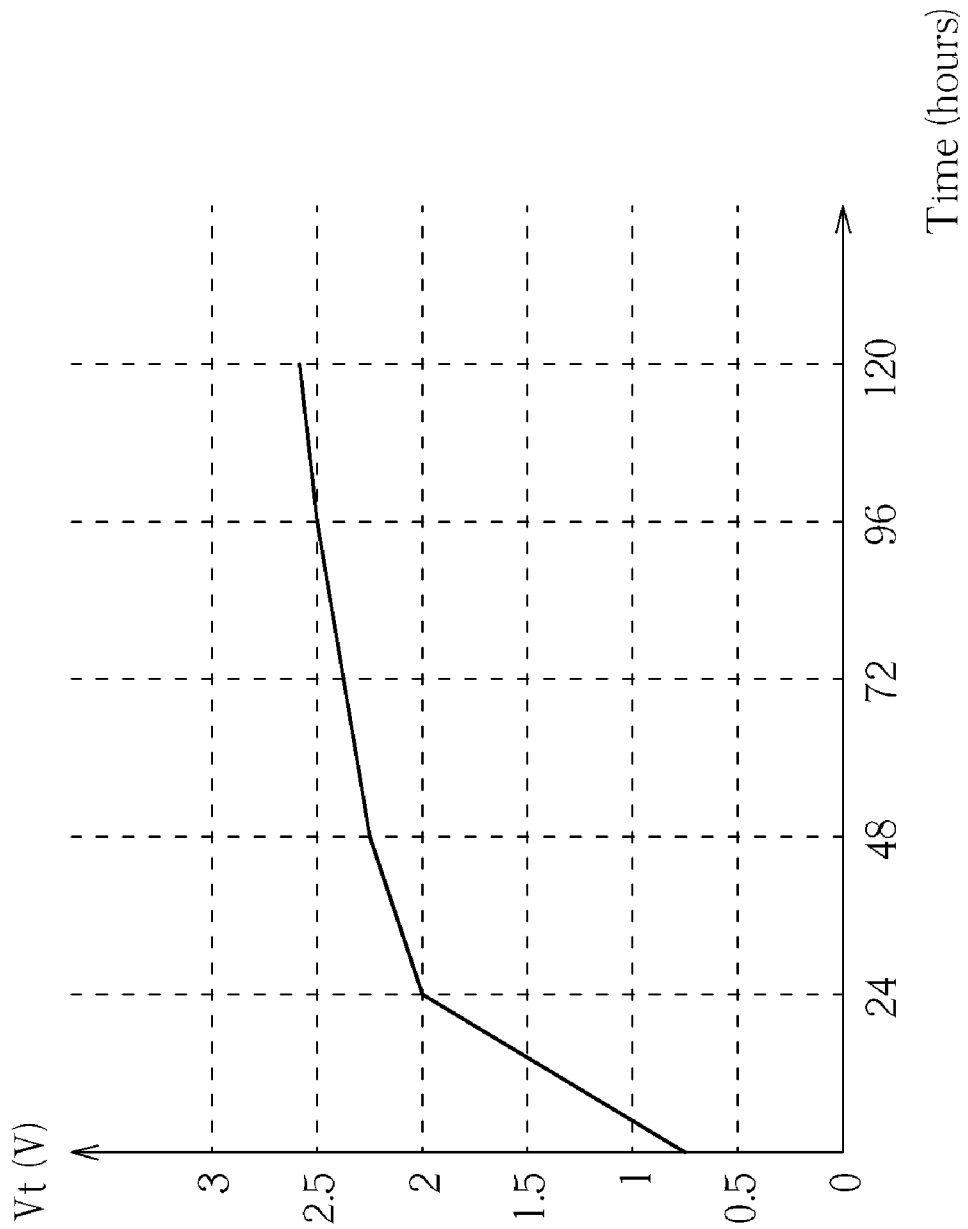
FIG. 2 is a diagram of a threshold voltage variation of a conventional HVMOS transistor versus time when the conventional HVMOS transistor is operated under maximum operating voltage.
Figure 3:
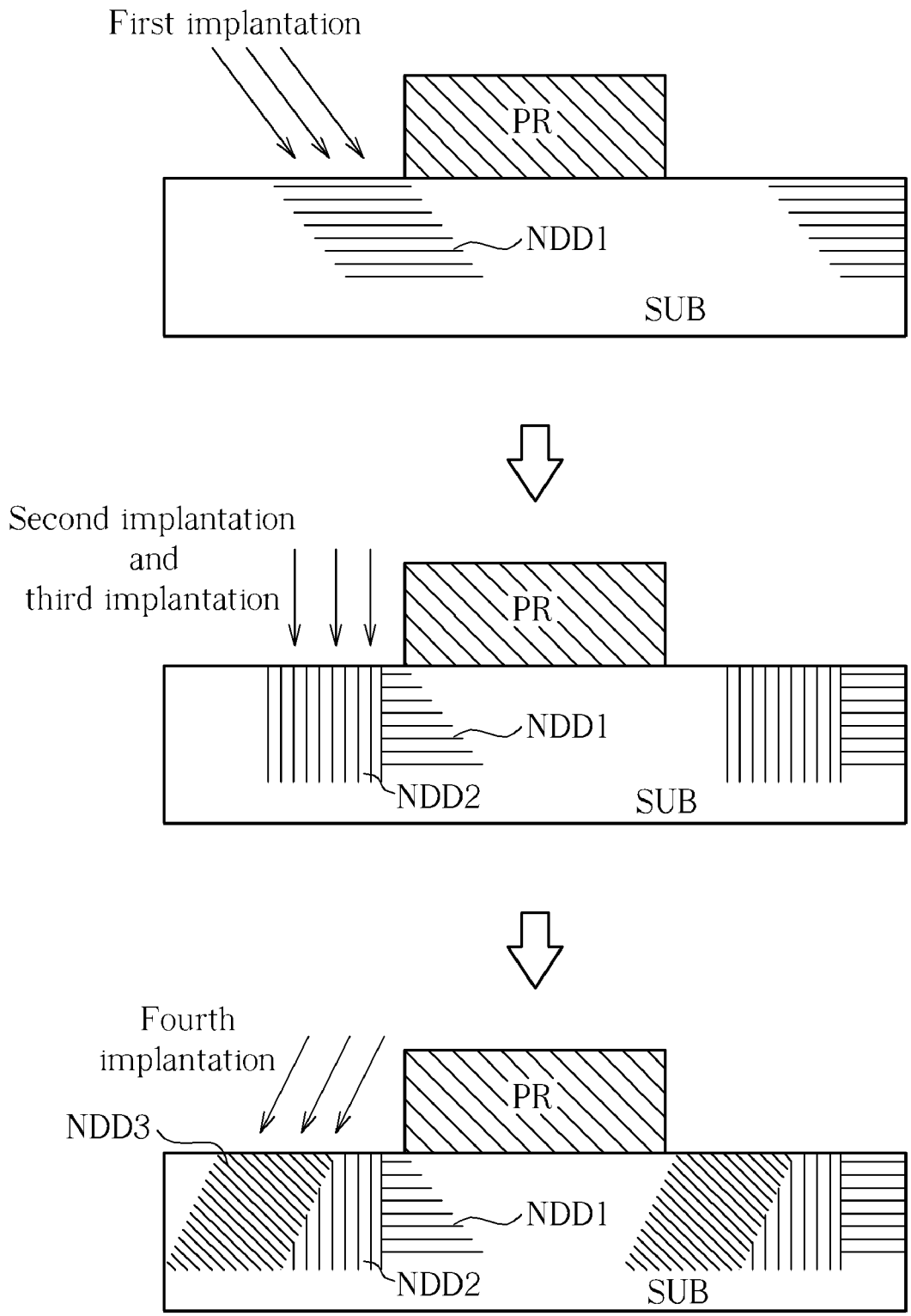
FIG. 3 is an exemplary partial flow of manufacturing an N-type drain drift region of a high voltage metal-oxide-semiconductor transistor according to an embodiment of the present invention.
Figure 4:
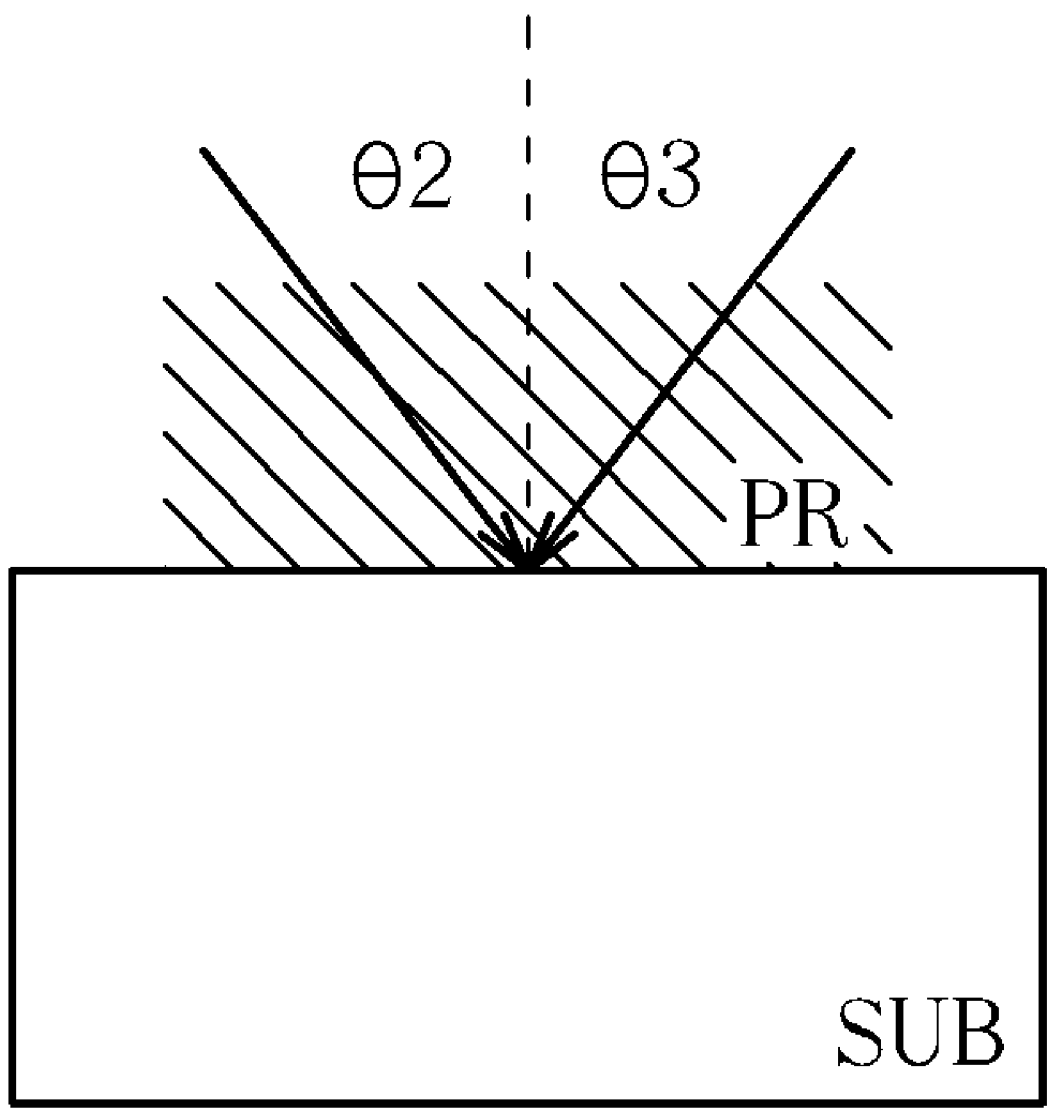
FIG. 4 is an exemplary diagram of the second doping implantation and the third doping implantation shown in FIG. 3 from a front side view according to an embodiment of the present invention.

Please refer to FIG. 3, which is an exemplary partial flow of manufacturing an N-type drain drift region (NDD region) of a high voltage metal-oxide-semiconductor (HVMOS) transistor according to an embodiment of the present invention. Firstly, a photoresist PR is placed at a predetermined location of a gate poly on a substrate SUB, and a first N-type doping implantation is performed at a first tilt angle θ1 (for example, an angle from 7° to 45°), as indicated by the arrow symbols, to form a first implantation region NDD1. In the next step, a second doping implantation and a third doping implantation is performed at a second tilt angle θ2 and a third tile angle θ3 from different directions, respectively, to form a second implantation NDD2. Please refer to FIG. 4 for a more detailed illustration of the second doping implantation and the third doping implantation, FIG. 4 is an exemplary diagram of the second doping implantation and the third doping implantation shown in FIG. 3 from a front side view according to an embodiment of the present invention. The arrow symbols represent the second doping implantation and the third doping implantation being performed. Finally, a fourth N-type doping implantation is performed at a fourth tilt angle θ4, as indicated by the arrow symbols, to form a third implantation region NDD3.

Figure 5:
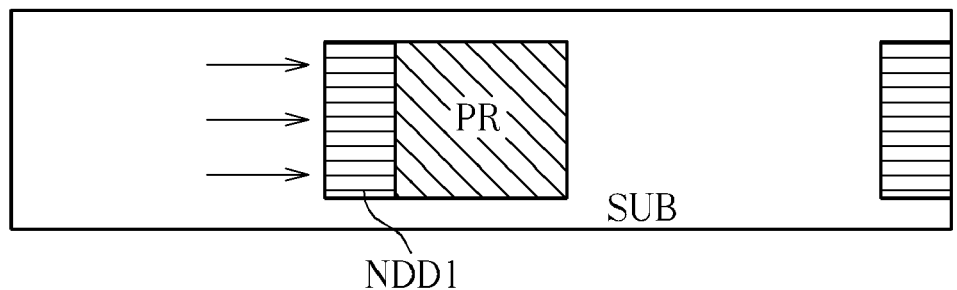
FIG. 5 is an exemplary diagram of the flow shown in FIG. 3 from an overhead view according to an embodiment of the present invention.
Figure 5:
Figure 5:
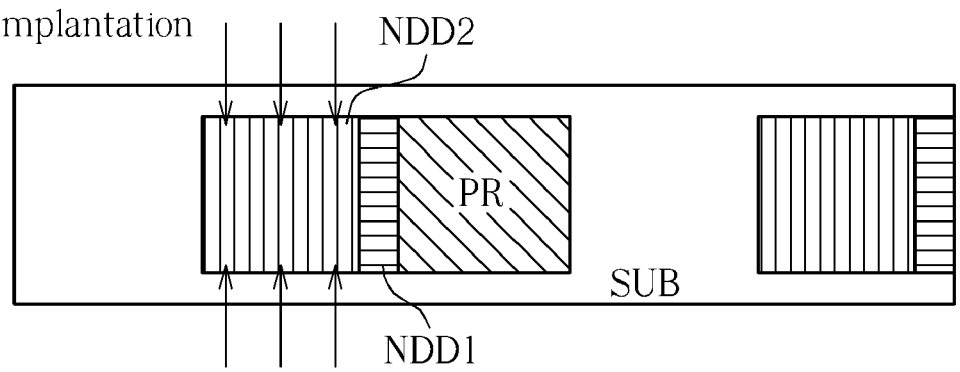
Figure 5:
Figure 5:
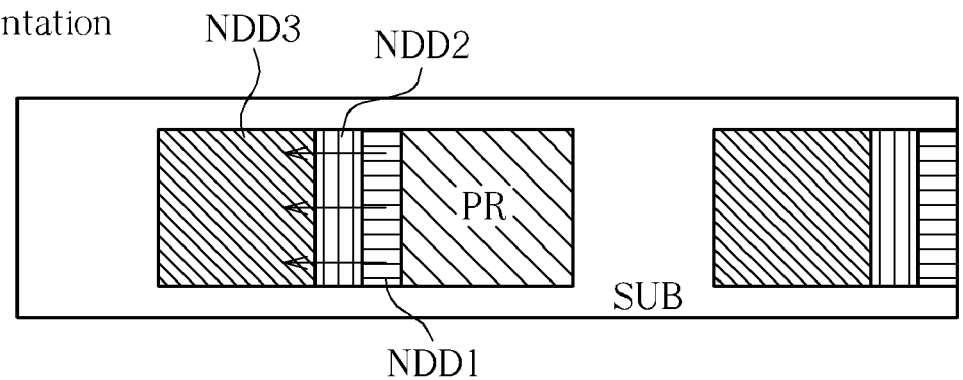

Please refer to FIG. 5 for a clearer view of the aforementioned flow. FIG. 5 is an exemplary diagram of the flow shown in FIG. 3 from an overhead view according to an embodiment of the present invention. It can be clearly seen from FIG. 3, FIG. 4 and FIG. 5 that an NDD region, including the first implantation region NDD1, the second implantation region NDD2 and the third implantation region NDD3, is manufactured with a gradient doping concentration. In this example, assuming the first implantation region NDD1 has a concentration of 25% (i.e., the first implantation region NDD1 only benefits from one out of the four implantations), then the second implantation region NDD2 has a concentration of 75% (i.e., the second implantation region NDD2 benefits from three out of the four implantations), and the third implantation region NDD3 has a concentration of 100% (i.e. it benefits from all four implantations).

Figure 6:
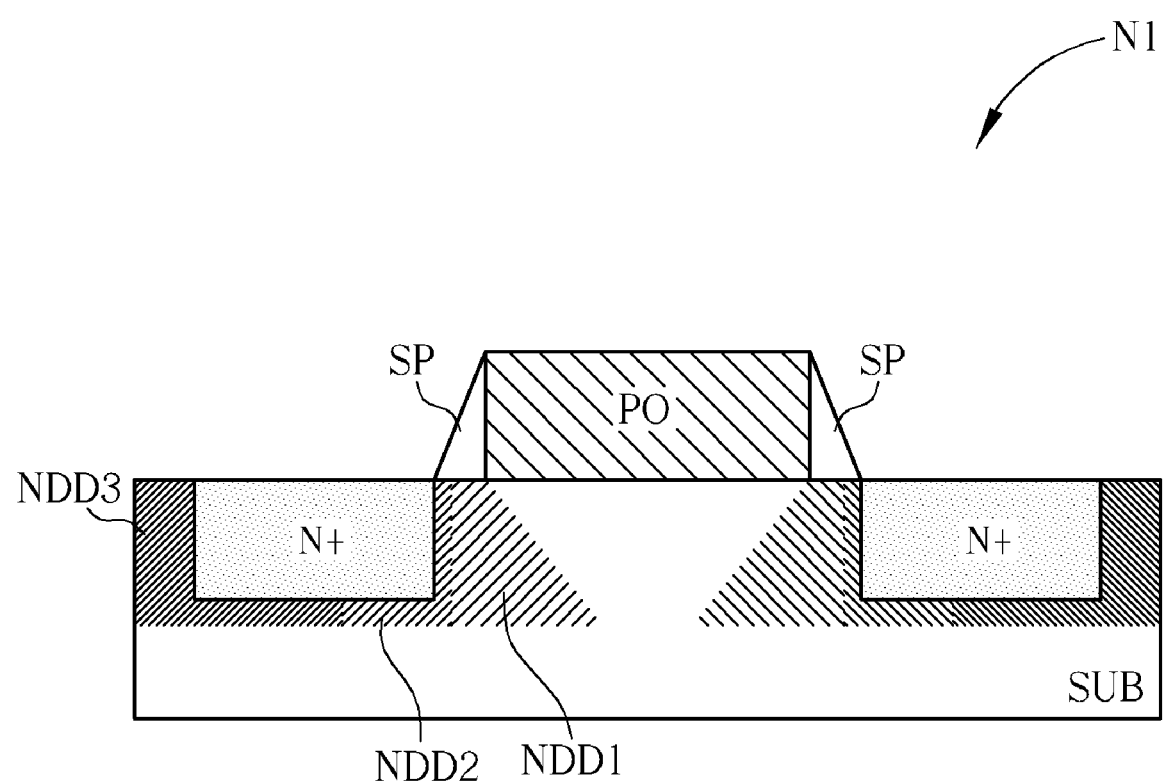
FIG. 6 is an exemplary structural diagram of an N-type HVMOS transistor according to an embodiment of the present invention.

Please refer to FIG. 6, which is an exemplary structural diagram of an N-type HVMOS transistor N1 according to an embodiment of the present invention. The N-type HVMOS transistor N1 has a gate poly PO guarded by two spacers SP, and two carrier plus regions N+ located within NDD regions (including the first implantation region NDD1, the second implantation region NDD2 and the third implantation region NDD3). When the N-type HVMOS transistor N1 is stressed, fewer hot carriers will be produced due to the gradient concentration in the NDD regions, and therefore the threshold voltage shift issue can be greatly relaxed.

The aforementioned design flow is only a preferred embodiment, and is not supposed to be a limitation to the present invention. For example, the NDD regions with gradient concentration can also be formed by performing a thermal diffusion. This kind of variation in design also falls within the scope of the present invention.

To summarize, the present invention provides an HVMOS transistor and a related manufacturing method. By fabricating NDD regions with gradient concentration, the hot carriers can be greatly reduced and the channel hot carrier phenomenon as well as threshold voltage shift issues can be relieved.

Those skilled in the art will readily observe that numerous modifications and alterations of the device and method may be made while retaining the teachings of the invention.

What is claimed is:

1. A high voltage metal-oxide-semiconductor (HVMOS) transistor, comprising:
    a gate, wherein a channel is formed in an area projected from the gate in a thickness direction when the HVMOS is activated;
    two carrier drain drift regions, adjacent to the area projected from the gate; and
    two carrier plus regions, respectively located within the two carrier drain drift regions, each carrier plus region is completely encompassed by each corresponding carrier drain drift region, wherein the two carrier plus regions and the two carrier drain drift regions are communicating with each other through the channel when the HVMOS is activated, wherein at least one of the carrier drain drift region comprises a first region, a second region and a third region, which are sequentially disposed from the channel to the carrier plus region, and the carrier drain drift region has a gradient doping concentration increased from the first region, the second region to the third region, wherein the carrier plus region directly contacts at least two of the first region, the second region and the third region.

2. The HVMOS transistor of claim 1, wherein each of the carrier drain drift regions has the gradient doping concentration.

3. The HVMOS transistor of claim 1, wherein the HVMOS transistor is an N-type transistor.

4. The HVMOS transistor of claim 3, wherein the carrier drain drift regions are N-type drain drift (NDD) regions.

5. The HVMOS transistor of claim 3, wherein the carrier plus regions are N-type plus (N+) regions.

* * * * *